(12) United States Patent
Yoshikawa et al.

(10) Patent No.: US 11,508,866 B2
(45) Date of Patent: Nov. 22, 2022

(54) PHOTOELECTRIC CONVERSION ELEMENT AND PHOTOELECTRIC CONVERSION DEVICE

(71) Applicant: KANEKA CORPORATION, Osaka (JP)

(72) Inventors: Kunta Yoshikawa, Settsu (JP); Takashi KuchIyama, Settsu (JP)

(73) Assignee: KANEKA CORPORATION, Osaka (JP)

(*) Notice: Subject to any disclaimer, the term of this patent is extended or adjusted under 35 U.S.C. 154(b) by 206 days.

(21) Appl. No.: 16/785,397

(22) Filed: Feb. 7, 2020

(65) Prior Publication Data
US 2020/0176628 A1 Jun. 4, 2020

Related U.S. Application Data

(63) Continuation of application No. PCT/JP2018/020772, filed on May 30, 2018.

(30) Foreign Application Priority Data

Aug. 9, 2017 (JP) .............................. JP2017-154488

(51) Int. Cl.
*H01L 31/101* (2006.01)
*H01L 31/0216* (2014.01)
(Continued)

(52) U.S. Cl.
CPC .... *H01L 31/1016* (2013.01); *H01L 31/02161* (2013.01); *H01L 31/022408* (2013.01); *H01L 31/022466* (2013.01); *H01L 31/1037* (2013.01)

(58) Field of Classification Search
CPC ........... H01L 31/1016; H01L 31/02161; H01L 31/022408; H01L 31/022466;
(Continued)

(56) References Cited

U.S. PATENT DOCUMENTS 4,926,036 A 5/1990 Maeda
5,253,237 A 10/1993 Miyake et al.
(Continued)

FOREIGN PATENT DOCUMENTS

EP 3 171 406 A1 5/2017
JP S61-069170 A 4/1986
(Continued)

OTHER PUBLICATIONS

International Search Report issued in PCT/JP2018/020772; dated Jun. 26, 2018.

*Primary Examiner* — Hoang-Quan Ho
(74) *Attorney, Agent, or Firm* — Studebaker & Brackett PC

(57) ABSTRACT

A photoelectric conversion element for detecting the spot size of incident light. The photoelectric conversion element includes a photoelectric conversion substrate having two principal surfaces, and comprises a first sensitive part and a second sensitive part that have mutually different photoelectric conversion characteristics. When a sensitive region appearing in the principal surface of the first sensitive part is defined as a first sensitive region, and a sensitive region appearing in the principal surface of the second sensitive part is defined as a second sensitive region, the first sensitive region is configured to receive at least a portion of light incident on a light-receiving surface and to decrease, proportionally to enlargement in an irradiation region of the principal surface irradiated with the incident light, the ratio of the first sensitive region to the second sensitive region in the irradiation region.

18 Claims, 14 Drawing Sheets

(51) Int. Cl.
*H01L 31/0224* (2006.01)
*H01L 31/103* (2006.01)

(58) Field of Classification Search
CPC .......... H01L 31/1037; H01L 31/02024; H01L 31/03529; H01L 31/109; Y02E 10/50
See application file for complete search history.

(56) References Cited

U.S. PATENT DOCUMENTS

| | | | |
|---|---|---|---|
| 5,825,071 A * | 10/1998 | Takakura | .............. H01L 31/103 257/E27.128 |
| 5,858,810 A | 1/1999 | Takakura | |
| 5,898,209 A | 4/1999 | Takakura | |
| 6,097,074 A | 8/2000 | Takakura | |
| 6,372,531 B1 | 4/2002 | Fujii | |
| 2006/0044545 A1 * | 3/2006 | Horn | ........................ G01C 3/08 356/4.03 |
| 2015/0340402 A1 | 11/2015 | Yamanaka et al. | |

FOREIGN PATENT DOCUMENTS

| | | |
|---|---|---|
| JP | S63-151085 A | 6/1988 |
| JP | S63-119266 U | 8/1988 |
| JP | H01-266770 A | 10/1989 |
| JP | H02-062921 A | 3/1990 |
| JP | H03-086930 A | 4/1991 |
| JP | H06-048575 Y2 | 12/1994 |
| JP | H08-018093 A | 1/1996 |
| JP | 2001-284632 A | 10/2001 |
| JP | 2005-209294 A | 8/2005 |
| JP | 2014-107446 A | 6/2014 |
| JP | 6093061 B2 | 3/2017 |
| WO | 2011/013172 A1 | 2/2011 |

* cited by examiner

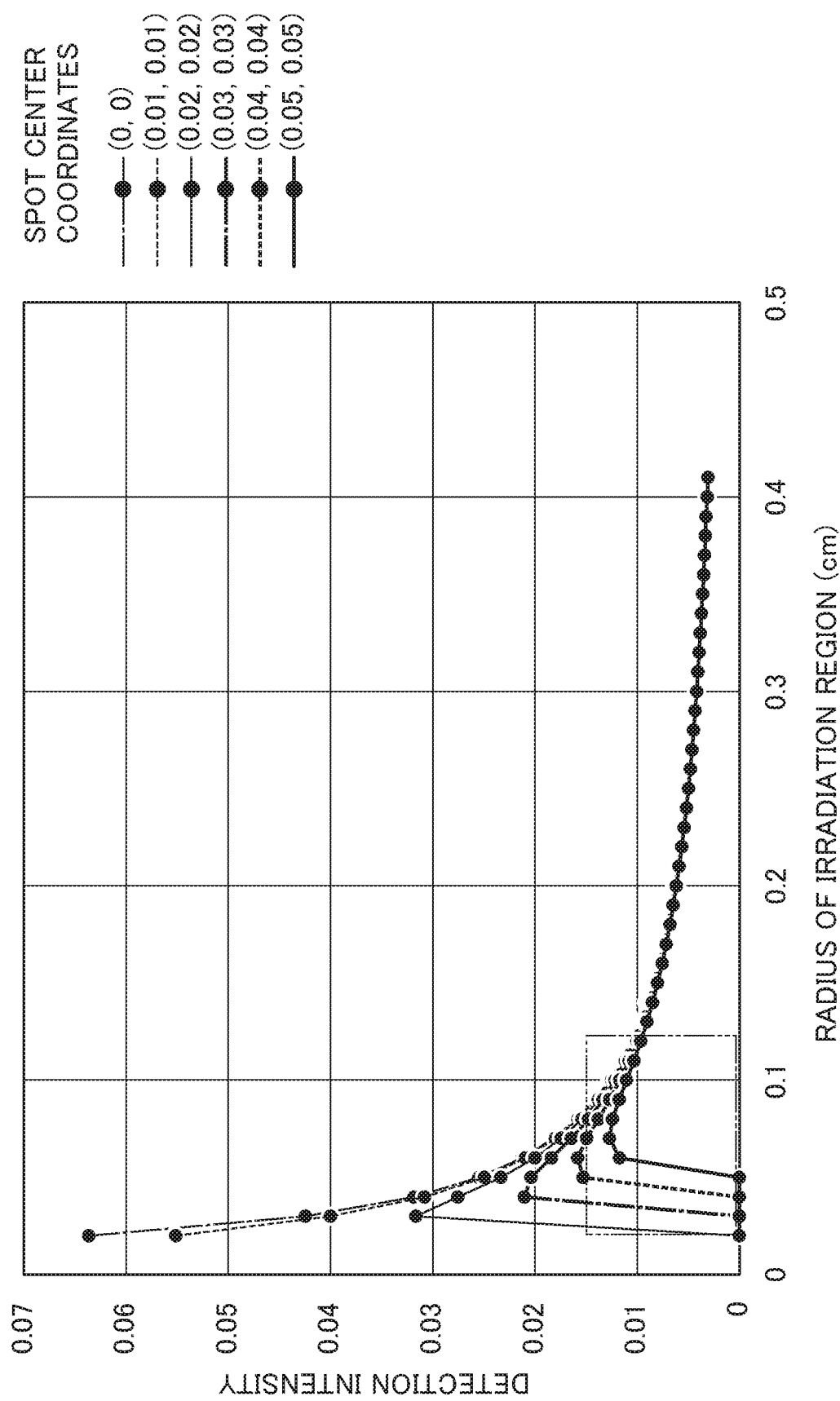

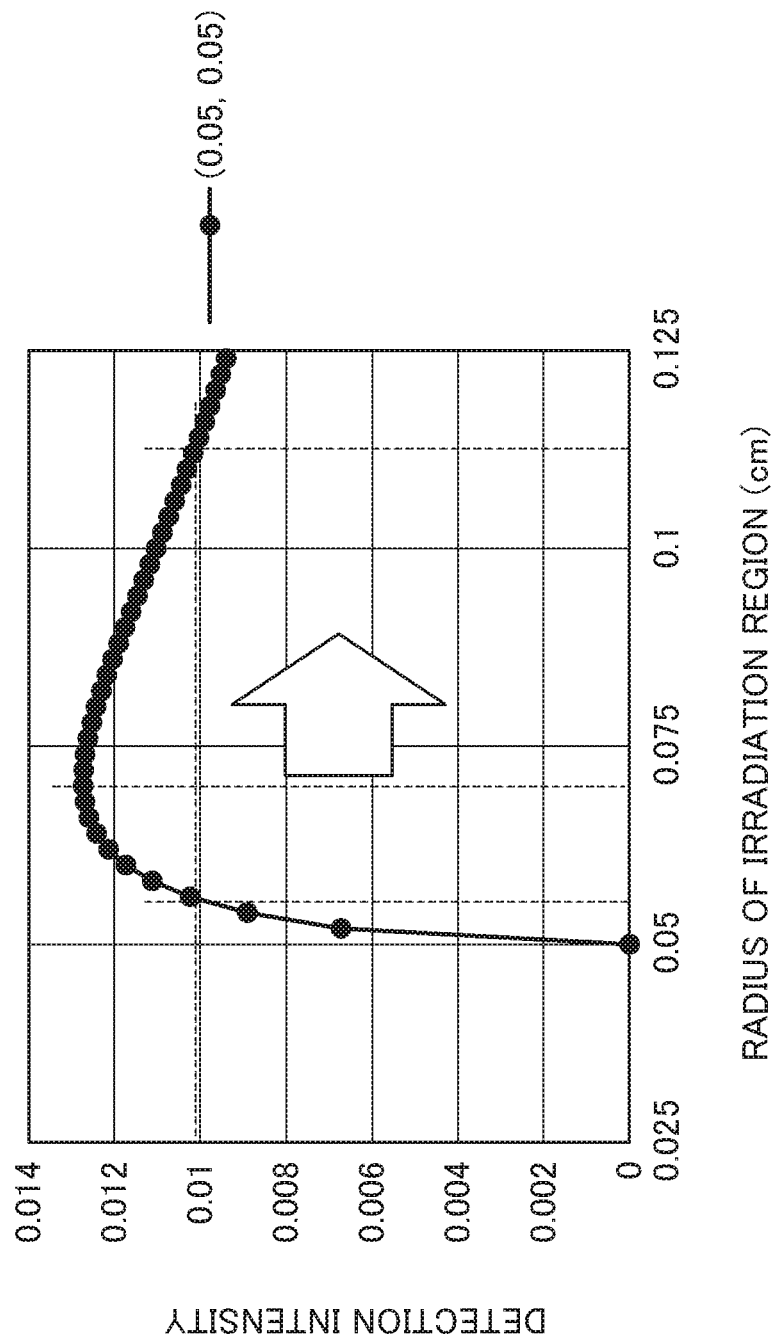

PHOTOELECTRIC CONVERSION ELEMENT AND PHOTOELECTRIC CONVERSION DEVICE

CROSS-REFERENCE TO RELATED APPLICATIONS

This application claims benefit of priority to International Patent Application No. PCT/JP2018/020772, filed May 30, 2018, and to Japanese Patent Application No. 2017-154488, filed Aug. 9, 2017, the entire contents of each are incorporated herein by reference.

BACKGROUND

Technical Field

The present disclosure relates to a photoelectric conversion element and a photoelectric conversion device used in the field of light detection or the like.

Background Art

Japanese Patent No. 6093061 discloses a photoelectric conversion element (semiconductor light receiving element) for detecting the intensity (illuminance) of incident light. An element using a crystalline silicon substrate is, for example, known as such a photoelectric conversion element. In the photoelectric conversion element using the crystalline silicon substrate, a dark current is relatively small and an S/N ratio is relatively high and sensitivity is high (stable response without depending on illuminance) even if the intensity of incident light is low.

SUMMARY

There is a demand for a photoelectric conversion element capable of detecting the spot size of incident light.

Accordingly, the present disclosure provides a photoelectric conversion element and a photoelectric conversion device for detecting the spot size of incident light.

A photoelectric conversion element according to the present disclosure is a photoelectric conversion element including a photoelectric conversion substrate having two principal surfaces, and includes a first sensitive part and a second sensitive part having different photoelectric conversion characteristics. When a sensitive region appearing on the principal surface of the first sensitive part is defined as a first sensitive region and a sensitive region appearing on the principal surface of the second sensitive part is defined as a second sensitive region, the first sensitive region receives at least a portion of incident light incident on the principal surface and forms a pattern for decreasing a ratio of the first sensitive region to the second sensitive region in an irradiation region as the irradiation region irradiated with the incident light on the principal surface increases.

A photoelectric conversion device according to the present disclosure includes a first photoelectric conversion element arranged on an upstream side of incident light and the above photoelectric conversion element arranged on a downstream side of the incident light and serving as a second photoelectric conversion element.

According to the present disclosure, it is possible to provide a photoelectric conversion element and a photoelectric conversion device for detecting the spot size of incident light.

BRIEF DESCRIPTION OF THE DRAWINGS

FIG. 7A is a graph showing an example of characteristics of the detection intensity of the incident light in relation to a radius of the irradiation region of the incident light with the second photoelectric conversion element;

FIG. 7B is a graph enlargedly showing a part Z of the characteristic when a deviation amount of a center position of the irradiation region of the incident light in FIG. 7A is (0.05, 0.05);

DETAILED DESCRIPTION

Embodiments of the present disclosure will be described with reference to the accompanying drawings below. Same or corresponding parts shall be denoted by the same reference numbers in each drawing. For the sake of convenience, hatching, member reference numbers, etc. may be omitted. However, in such cases, other drawings shall be referred to.

First Embodiment

Figure 1:
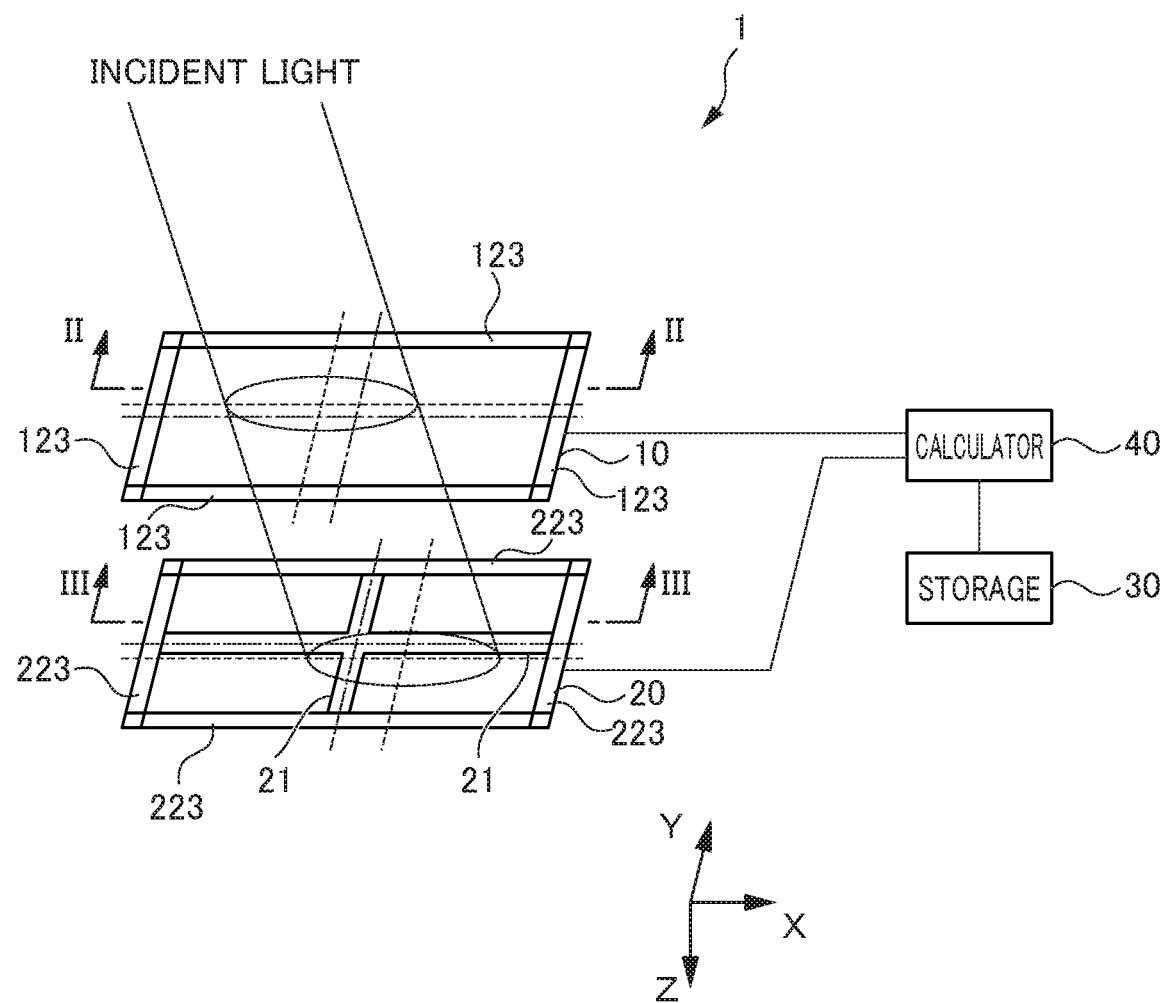
FIG. 1 is a view showing the configuration of a photoelectric conversion device according to a first embodiment.

FIG. 1 is a view showing the configuration of a photoelectric conversion device according to a first embodiment. The photoelectric conversion device 1 shown in FIG. 1 detects not only the intensity of incident light, but also the spot size and incident direction of the incident light. The photoelectric conversion device 1 includes a first photoelectric conversion element 10 arranged on an upstream side in a light propagation direction, a second photoelectric conversion element 20 arranged on a downstream side in the light propagation direction, a storage 30 and a calculator 40.

An XYZ orthogonal coordinate system is shown in FIG. 1 and figures to be described later. An XY plane is a plane parallel to light receiving surfaces of the first photoelectric conversion element 10 and the second photoelectric conversion element 20 and a Z direction is a direction orthogonal to the XY plane.

In FIG. 1 and the figures to be described later, an intersection of two dashed-dotted lines in a plan view indicates a center of the XY plane; one dashed-dotted line is parallel to an X direction and the other dashed-dotted line is parallel to a Y direction. An intersection of two dotted lines in the plan view indicates a center of the spot size of incident light on the XY plane; one dotted line is parallel to the X direction and the other dotted line is parallel to the Y direction.

The first photoelectric conversion element 10 generates a current corresponding to the intensity (total amount) of incident light incident on the light receiving surface. The first photoelectric conversion element 10 distributes and outputs the generated current to four electrode layers 123 (and electrode layers 133 on a back surface side to be described later) arranged on four sides according to a center position (coordinates) (hereinafter, also referred to as an XY position) of the incident light on the light receiving surface (XY plane). The first photoelectric conversion element 10 also transmits the incident light. The configuration of the first photoelectric conversion element 10 is described in detail later.

The second photoelectric conversion element 20 generates a current corresponding to the intensity of the incident light incident on a high-sensitive part (to be described in detail later). In this way, the second photoelectric conversion element 20 generates a current corresponding to the density of the incident light, i.e. a current corresponding to the spot size of the incident light (to be described in detail later). The second photoelectric conversion element 20 distributes and outputs the generated current to four electrode layers 223 (and electrode layers 233 on a back surface side to be described later) arranged on four sides according to a center position (coordinates) (hereinafter, also referred to as an XY position) of the incident light on the light receiving surface (XY plane). The configuration of the second photoelectric conversion element 20 is described in detail later.

The storage 30 stores in advance a table associating an output current (total amount) of the first photoelectric conversion element 10 (i.e. the intensity (total amount) of incident light on the first photoelectric conversion element 10) and an output current (total amount) of the second photoelectric conversion element 20 (i.e. the intensity of the incident light on the high-sensitive part of the second photoelectric conversion element 20) with the spot size of the incident light on the light receiving surface of the second photoelectric conversion element 20 for each XY position (coordinates) of the incident light on the light receiving surface of the second photoelectric conversion element 20. The storage 30 is a rewritable memory such as an EEPROM.

The calculator 40 calculates and detects the intensity (total amount) of the incident light according to the total amount of currents output from the four electrode layers 123 (133) of the first photoelectric conversion element 10.

The calculator 40 also calculates and detects the XY position (coordinates) of the incident light on the light receiving surface of the first photoelectric conversion element 10 based on a ratio of the currents output from each of the four electrode layers 123 (133) of the first photoelectric conversion element 10. Similarly, the calculator 40 also calculates and detects the XY position (coordinates) of the incident light on the light receiving surface of the second photoelectric conversion element 20 based on a ratio of currents output from each of the four electrode layers 223 (233) of the second photoelectric conversion element 20. The calculator 40 calculates and detects an incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four electrode layers 123 (133) of the first photoelectric conversion element 10 (i.e. the intensity (total amount) of the incident light on the first photoelectric conversion element 10) and the total amount of the currents output from the four electrode layers 223 (233) of the second photoelectric conversion element 20 (i.e. the intensity of the incident light on the high-sensitive part of the second photoelectric conversion element 20) at the XY position (coordinates) of the incident light on the light receiving surface of the second photoelectric conversion element 20.

The calculator 40 is constituted by an arithmetic processor such as a DSP (Digital Signal Processor) or an FPGA (Field-Programmable Gate Array). Various functions of the calculator 40 are realized, for example, by executing a predetermined software (program, application) stored in the storage 30. Various functions of the calculator 40 may be realized by the cooperation of a hardware and a software or may be realized only by a hardware (electronic circuit). The configurations of the first photoelectric conversion element 10 and the second photoelectric conversion element 20 are described in detail below.

<First Photoelectric Conversion Element>

Figure 2:
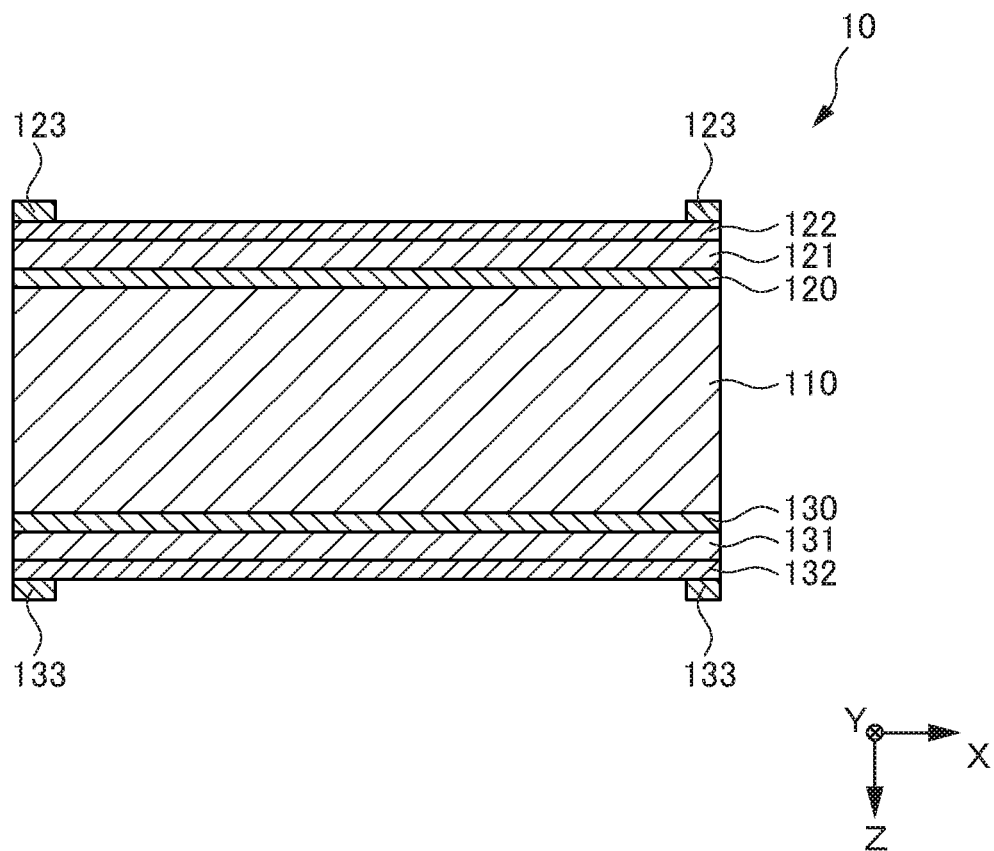
FIG. 2 is an end face view along line II-II in a first photoelectric conversion element of FIG. 1.

FIG. 2 is an end face view along line II-II of the first photoelectric conversion element 10 of FIG. 1. The first photoelectric conversion element 10 is provided with an n-type (second conductivity type) semiconductor substrate (photoelectric conversion substrate) 110 having two principal surfaces, and a passivation layer 120, a p-type (first conductivity type) semiconductor layer 121, a transparent electrode layer 122 and the electrode layers 123 successively laminated on a light receiving surface side, which is one principal surface on a light receiving side, out of the principal surfaces of the semiconductor substrate 110. The first photoelectric conversion element 10 is also provided with a passivation layer 130, an n-type (second conductivity type) semiconductor layer 131, a transparent electrode layer 132 and the electrode layers 133 successively laminated on a part of a back surface side, which is the other principal surface on a side opposite to the light receiving side, out of the principal surfaces of the semiconductor substrate 110.

The semiconductor substrate (photoelectric conversion substrate) 110 is formed of a crystalline silicon material such as single-crystal silicon or multi-crystal silicon. The semiconductor substrate 110 is, for example, an n-type semiconductor substrate in which the crystalline silicon material is doped with an n-type dopant. An example of the n-type dopant may include phosphorus (P). By using the crystalline silicon as the material of the semiconductor substrate 110, a dark current is relatively small, and an S/N ratio is relatively high and sensitivity is high (stable response without depending on illuminance) even if the intensity of the incident light is low.

The passivation layer 120 is formed on the light receiving surface side of the semiconductor substrate 110, and the passivation layer 130 is formed on the back surface side of the semiconductor substrate 110. The passivation layers 120, 130 are, for example, formed of an intrinsic (i-type) amorphous silicon material. The passivation layers 120, 130 suppress the recombination of carriers generated in the semiconductor substrate 210 and enhance carrier recovery efficiency.

The p-type semiconductor layer 121 is formed on the passivation layer 120. The p-type semiconductor layer 121 is, for example, formed of an amorphous silicon material. The p-type semiconductor layer 121 is, for example, a p-type semiconductor layer in which the amorphous silicon material is doped with a p-type dopant. An example of the p-type dopant may include boron (B).

The n-type semiconductor layer 131 is formed on the passivation layer 130. The n-type semiconductor layer 131 is, for example, formed of an amorphous silicon material. The n-type semiconductor layer 131 is, for example, an n-type semiconductor layer in which the amorphous silicon material is doped with an n-type dopant (e.g. phosphorus (P) described above). The aforementioned passivation layers 120, 130, p-type semiconductor layer 121 and n-type semiconductor layer 131 are formed, for example, using a CVD method.

The transparent electrode layer 122 is formed on the p-type semiconductor layer 121, and the transparent electrode layer 132 is formed on the n-type semiconductor layer 131. The transparent electrode layers 122, 132 are formed of a transparent conductive material. ITO (Indium Tin Oxide: complex oxide of indium oxide and tin oxide) or the like is given as an example of the transparent conductive material. The transparent electrode layers 122, 132 are formed, for example, using a sputtering method.

Four electrode layers 123 are independently formed on the respective four sides on the transparent electrode layer 122, and four electrode layers 133 are independently formed on the respective four sides on the transparent electrode layer 132. The electrode layers 123, 133 are formed of a conductive paste material containing metal powder such as silver powder. The electrode layers 123, 133 are formed, for example, using a printing method.

<Second Photoelectric Conversion Element>

Figure 3:
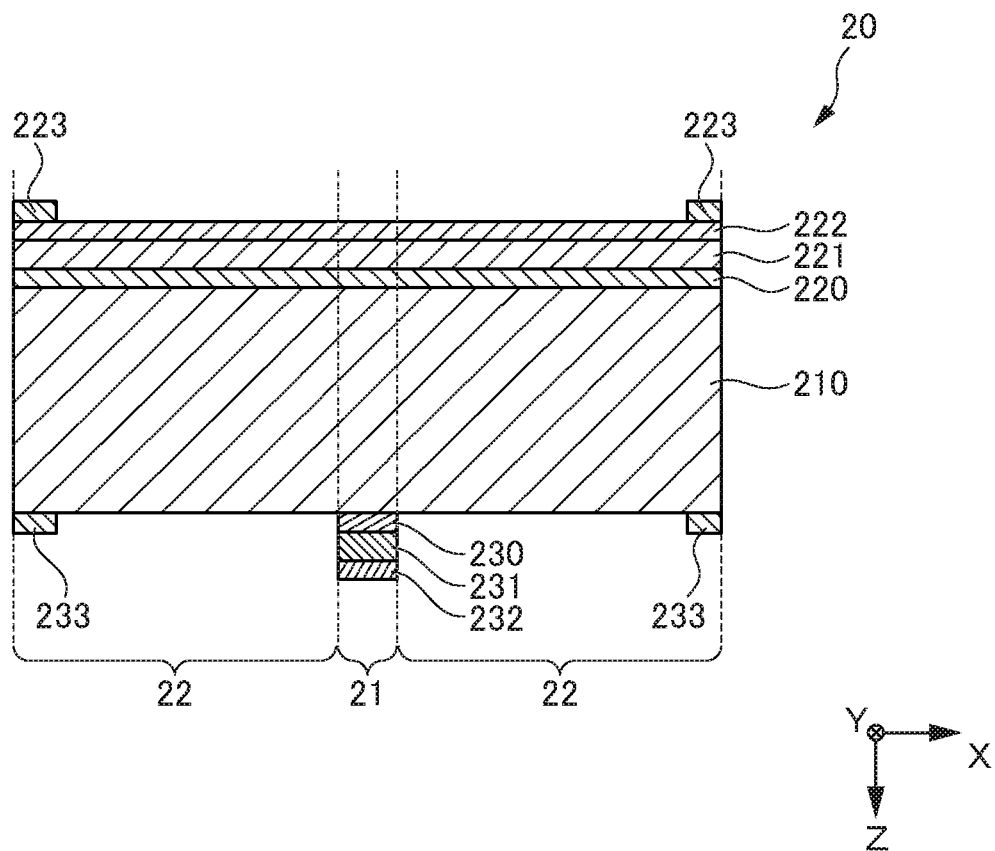
FIG. 3 is an end face view along line III-III in a second photoelectric conversion element of FIG. 1.

FIG. 3 is an end face view along line III-III of the second photoelectric conversion element 20 of FIG. 1. The second photoelectric conversion element 20 is provided with an n-type (second conductivity type) semiconductor substrate (photoelectric conversion substrate) 210 having two principal surfaces, and a passivation layer 220, a p-type (first conductivity type) semiconductor layer 221, a transparent electrode layer 222 and the electrode layers 223 successively laminated on a light receiving surface side, which is one principal surface on a light receiving side, out of the principal surfaces of the semiconductor substrate 210. The second photoelectric conversion element 20 is also provided with a passivation layer 230, an n-type (second conductivity type) semiconductor layer 231 and a transparent electrode layer 232 successively laminated in a specific region on a back surface side, which is the other principal surface on a side opposite to the light receiving surface, out of the principal surfaces of the semiconductor substrate 210, and is also provided with the electrode layers 233 laminated outside the specific region (to be described in detail later) of the back surface.

A laminated part in this specific region, i.e. a laminated part formed by the transparent electrode layer 232, the n-type semiconductor layer 231, the passivation layer 230, the semiconductor substrate 210, the passivation layer 220, the p-type semiconductor layer 221 and the transparent electrode layer 222 is referred to as a high-sensitive part 21, and laminated parts other than in the specific region are referred to as low-sensitive parts 22.

The semiconductor substrate (photoelectric conversion substrate) 210 is formed of a crystalline silicon material such as single-crystal silicon or multi-crystal silicon similarly to the semiconductor substrate 110 of the aforementioned first photoelectric conversion element 10. The semiconductor substrate 210 is, for example, an n-type semiconductor substrate in which the crystalline silicon material is doped with an n-type dopant (e.g. phosphorus (P) described above). By using the crystalline silicon as the material of the semiconductor substrate 210, a dark current is relatively small, and an S/N ratio is relatively high and sensitivity is high (stable response without depending on illuminance) even if the intensity of the incident light is low.

The passivation layer 220 is formed in both the high-sensitive part 21 and the low-sensitive parts 22 on the light receiving surface side of the semiconductor substrate 210, and the passivation layer 230 is formed only in the high-sensitive part 21 on the back surface side of the semiconductor substrate 210. The passivation layers 220, 230 are, for example, formed of an intrinsic (i-type) amorphous silicon material similarly to the passivation layers 120, 130 of the aforementioned first photoelectric conversion element 10. The passivation layers 220, 230 suppress the recombination of carriers generated in the high-sensitive part 21 of the semiconductor substrate 210 and enhance carrier recovery efficiency.

The p-type semiconductor layer 221 is formed on the passivation layer 220, i.e. in both the high-sensitive part 21 and the low-sensitive parts 22 on the light receiving surface side of the semiconductor substrate 210. The p-type semiconductor layer 221 is, for example, formed of an amorphous silicon material similarly to the p-type semiconductor layer 121 of the aforementioned first photoelectric conversion element 10. The p-type semiconductor layer 221 is, for example, a p-type semiconductor layer in which the amorphous silicon material is doped with a p-type dopant (e.g. boron (B) described above).

The n-type semiconductor layer 231 is formed on the passivation layer 230, i.e. only in the high-sensitive part 21 on the back surface side of the semiconductor layer 210. The n-type semiconductor layer 231 is, for example, formed of an amorphous silicon material similarly to the n-type semiconductor layer 131 of the aforementioned first photoelectric conversion element 10. The n-type semiconductor layer 231 is, for example, an n-type semiconductor layer in which the amorphous silicon material is doped with an n-type dopant (e.g. phosphorus (P) described above). The aforementioned passivation layers 220, 230, p-type semiconductor layer 221 and n-type semiconductor layer 231 are formed, for example, using a CVD method.

The transparent electrode layer 222 is formed on the p-type semiconductor layer 221, i.e. in both the high-sensitive part 21 and the low-sensitive parts 22 on the light receiving surface side of the semiconductor substrate 210, and the transparent electrode layer 232 is formed on the n-type semiconductor layer 231, i.e. only in the high-sensitive part 21 on the back surface side of the semiconductor substrate 210. The transparent electrode layers 222, 232 are formed of a transparent conductive material similarly to the transparent electrode layers 122, 132 of the aforementioned first photoelectric conversion element 10. The transparent electrode layers 222, 232 are formed, for example, using a sputtering method.

Four electrode layers 223 are independently formed on the respective four sides on the transparent electrode layer 222, and four electrode layers 233 are independently formed on the respective four sides on the transparent electrode layer 232. The electrode layers 223, 233 are formed of a conductive paste material containing metal powder such as silver powder, similarly to the electrode layers 123, 133 of the aforementioned first photoelectric conversion element 10. The electrode layers 223, 233 are formed, for example, using a printing method.

Figure 4:
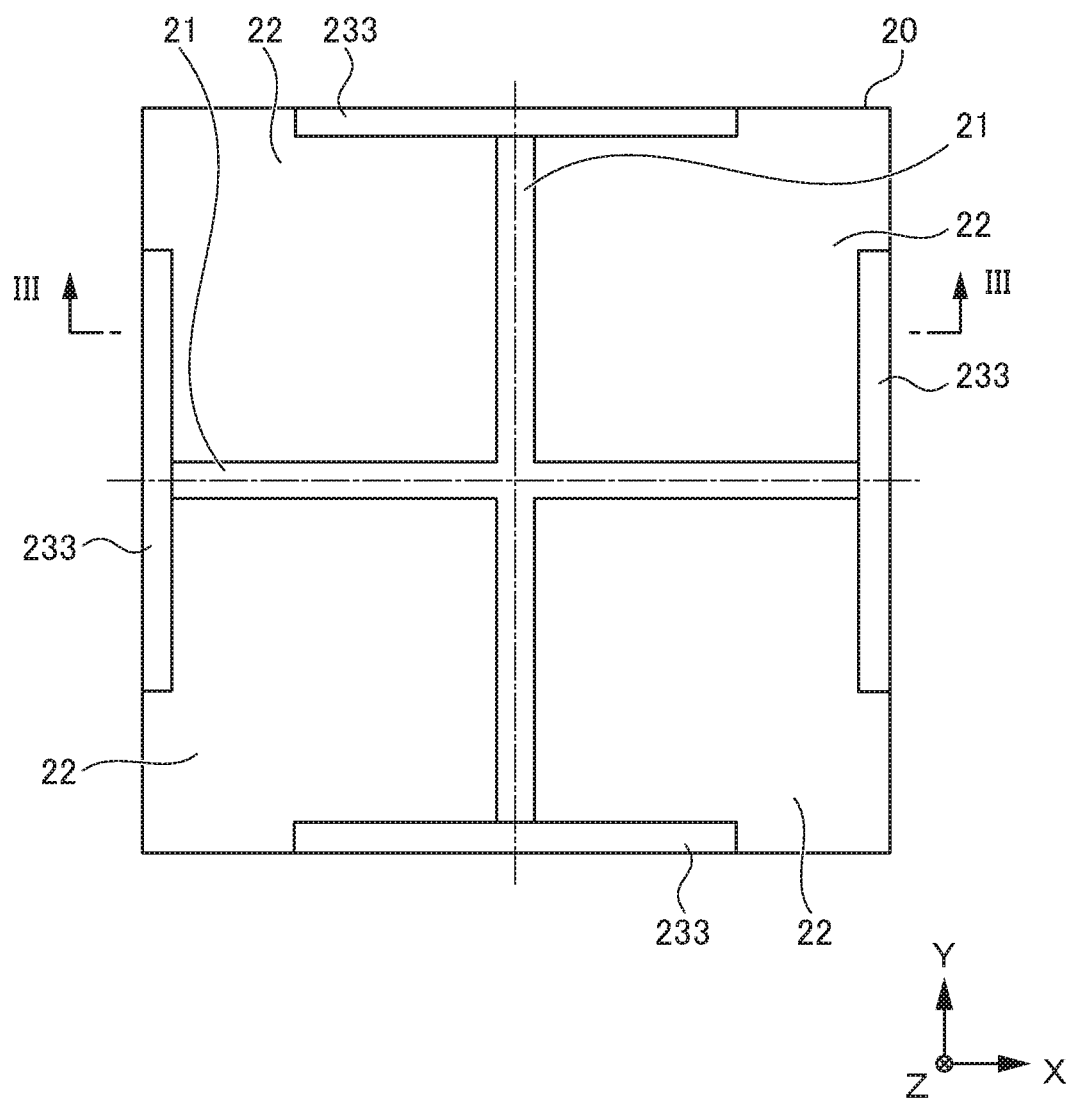
FIG. 4 is a view showing layers on a back surface side of a semiconductor substrate of the second photoelectric conversion element of FIGS. 1 and 3 from a light receiving surface side.

FIG. 4 is a view showing the layers 230, 231, 232 and 233 on the back surface side of the semiconductor substrate 210 of the second photoelectric conversion element 20 of FIGS. 1 and 3 from the light receiving surface side. As shown in FIGS. 3 and 4, the second photoelectric conversion element 20 has the high-sensitive part (first sensitive part) 21 and the low-sensitive parts (second sensitive parts) 22. Sensitive areas appearing on the both principal surfaces (light receiving surface and back surface) of the semiconductor substrate 210 in the high-sensitive part 21 are high-sensitive regions (first sensitive regions), and sensitive regions appearing on the both principal surfaces of the semiconductor substrate 210 in the low-sensitive parts 22 are low-sensitive regions (second sensitive regions).

In the high-sensitive part 21, the passivation layers 220, 230, the conductivity type semiconductor layers 221, 231 and the transparent electrode layers 222, 232 are formed on the light receiving surface side and the back surface side of the semiconductor substrate 210 as described with reference to FIG. 3. On the other hand, in the low-sensitive parts 22, the passivation layer 230, the n-type semiconductor layer 231 and the transparent electrode layer 232 are not formed on the back surface side of the semiconductor substrate 210.

In other words, the passivation layer 220, the conductivity type semiconductor layer 221 and the transparent electrode layer 222 are formed in the high-sensitive region on the light receiving surface side of the high-sensitive part 21 and in the low-sensitive regions on the light receiving surface sides of the low-sensitive parts 22, and the passivation layer 230, the n-type semiconductor layer 231 and the transparent electrode layer 232 are formed in the high-sensitive region on the back surface side of the high-sensitive part 21. On the other hand, the passivation layer 230, the n-type semiconductor layer 231 and the transparent electrode layer 232 are not formed in the low-sensitive regions on the back surface sides of the low-sensitive parts 22.

Since the passivation layers 220, 230 are formed on the light receiving surface side and the back surface side in the high-sensitive part 21, the recombination of carriers generated in the high-sensitive part 21 of the semiconductor substrate 210 is suppressed and a life time of the carriers is relatively long. Thus, carrier recovery efficiency is relatively high and photoelectric conversion efficiency is relatively high in the high-sensitive part 21. On the other hand, since the passivation layer 230 is not formed on the back surface side in the low-sensitive parts 22, the recombination of carriers generated in the low-sensitive parts 22 of the semiconductor substrate 210 is not suppressed and the life time of the carriers is relatively short. Thus, carrier recovery efficiency is relatively low and photoelectric conversion efficiency is relatively low in the low-sensitive parts 22. In this embodiment, since the n-type semiconductor layer 231 and the transparent electrode layer 232 are also not formed on the back surface sides of the low-sensitive parts 22, photoelectric conversion efficiency is nearly zero. In this application, "low sensitivity" shall include zero photoelectric conversion efficiency. As just described, the life time of the carrier differs and carrier recovery efficiency differs in the high-sensitive part 21 and the low-sensitive parts 22. As a result, photoelectric conversion efficiency (i.e. sensitivity) differs.

On the light receiving surface side of the low-sensitive part 22, the passivation layer 220, the p-type semiconductor layer 221 and the transparent electrode layer 222 are formed to be continuous with each of the passivation layer 220, the p-type semiconductor layer 221 and the transparent electrode layer 222 on the light receiving surface side of the high-sensitive part 21. Thus, optical characteristics (e.g. reflection characteristic) become uniform on the light receiving surface side.

Figure 5:
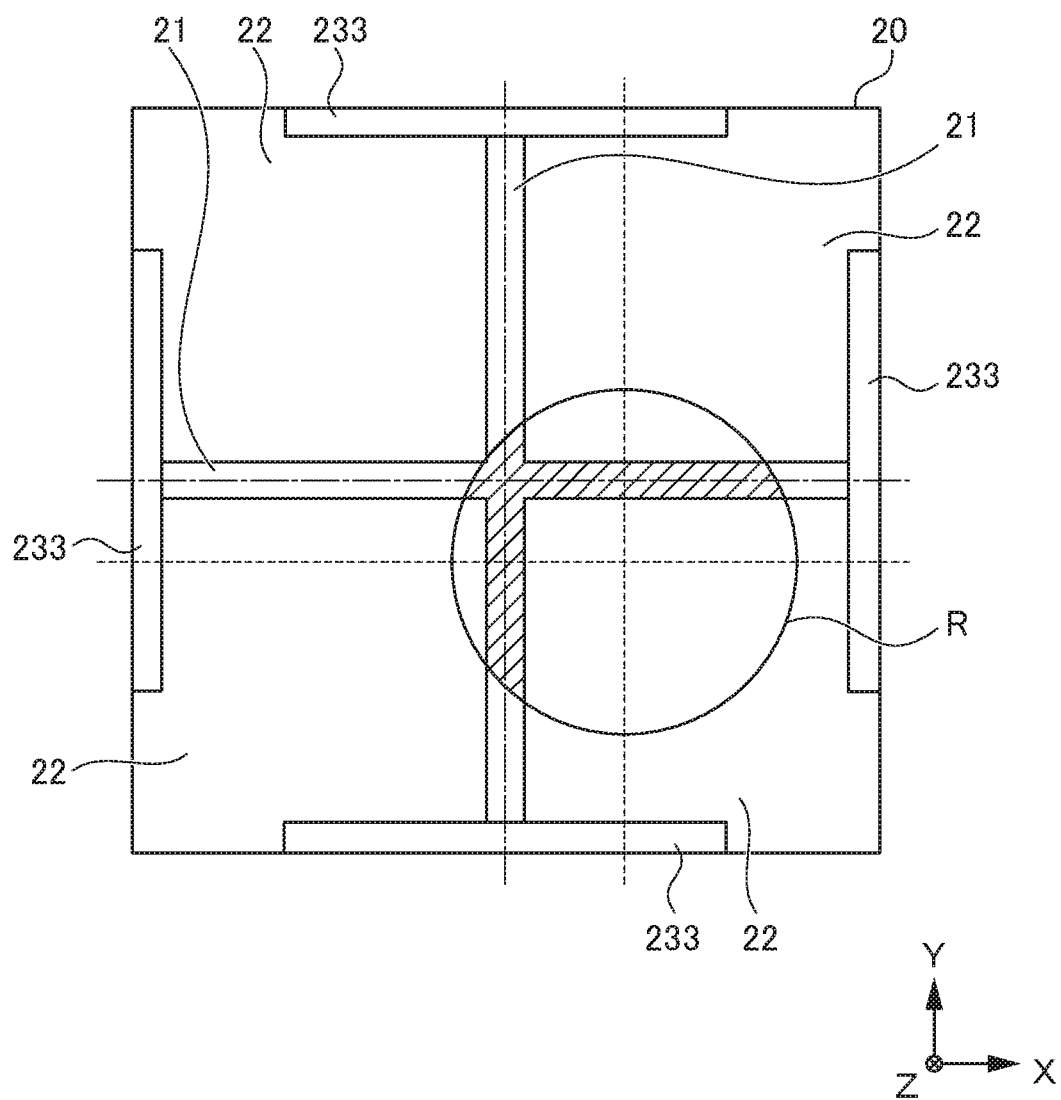
FIG. 5 is a view showing a state where incident light is incident on the second photoelectric conversion element of FIG. 4.

The high-sensitive region on the back surface side of the high-sensitive part 21 radially extends in the X and Y directions from a center of the light receiving surface and forms strip-like patterns orthogonal to each other. The strip-like patterns in the high-sensitive region on the back surface side of the high-sensitive part 21 have a constant width. Thus, as the irradiation region R irradiated with the incident light on the light receiving surface increases (i.e. as the density of the incident light decreases) as shown in FIG. 5, a ratio of the high-sensitive part 21 (high-sensitive region) to the low-sensitive parts 21 (low-sensitive regions) in the irradiation region R becomes smaller. Therefore, an output current decreases as the spot size of the incident light on the light receiving surface increases.

<Table>

Next, an example of a method for creating the table stored in the storage 30 is described. The table may be created through actual measurements or may be created using an approximate calculation as described below.

Figure 6:
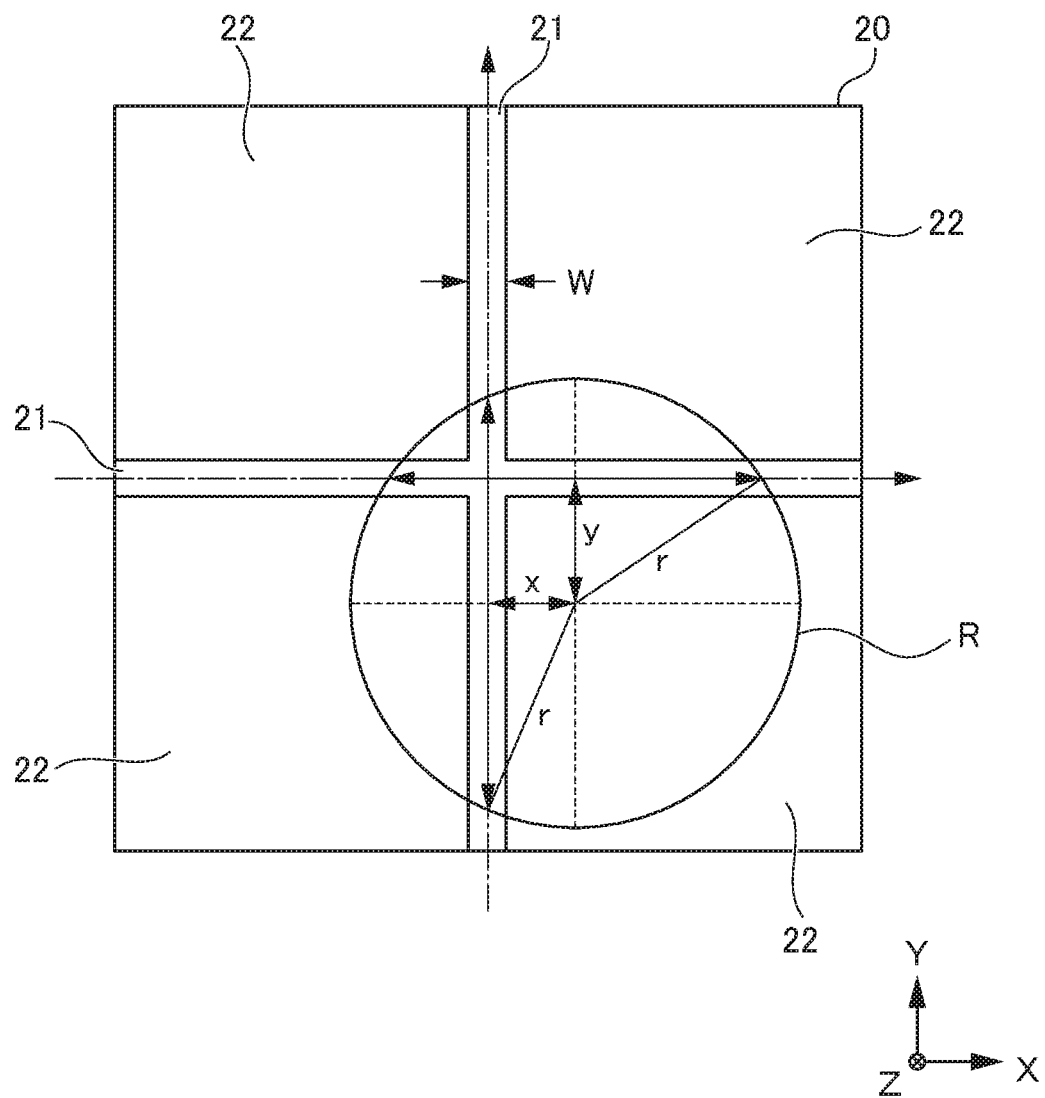
FIG. 6 is a view showing an approximate calculation of an overlap of an irradiation region of the incident light and a high-sensitive part on a light receiving surface of the second photoelectric conversion element.

FIG. 6 is a view showing an approximate calculation of an overlap of the irradiation region R of incident light on the light receiving surface of the second photoelectric conversion element 20 and the high-sensitive part 21 (high-sensitive region). As shown in FIG. 6, if it is assumed that (x, y) denotes a deviation amount of a center position of the irradiation region R of the incident light from the center position of the light receiving surface of the second photoelectric conversion element 20, r denotes a radius of the irradiation region R of the incident light, w denotes the width of the strip-like patterns of the high-sensitive part 21 (high-sensitive region) and r»w, an overlap of the irradiation region R of the incident light and a part of the high-sensitive part 21 (high-sensitive region) extending in the X direction is obtained by the following equation.

$$2 \times w \times \sqrt{(r^2 - y^2)}$$

An overlap of the irradiation region R of the incident light and a part of the high-sensitive part 21 (high-sensitive region) extending in the Y direction is obtained by the following equation.

$$2 \times w \times \sqrt{(r^2 - x^2)}$$

Thus, the overlap of the irradiation region R of the incident light and the high-sensitive part 21 (high-sensitive region) is obtained by the following equation.

$$2 \times w \times \sqrt{(r^2-y^2)} + 2 \times w \times \sqrt{(r^2-x^2)} - w^2$$

The table may be created using this approximate calculation.

FIG. 7A is a graph showing an example of characteristics of the detection intensity of the incident light in relation to the radius of the irradiation region R of the incident light with the second photoelectric conversion element 20. The characteristics when the deviation amount (x [cm], y [cm]) of the center position of the irradiation region R of the incident light from the center position of the light receiving surface is (0, 0), (0.01, 0.01), (0.02, 0.02), (0.03, 0.03), (0.04, 0.04) and (0.05, 0.05) are shown in FIG. 7A. FIG. 7B is a graph enlargedly showing a part (part enclosed by a two-dot chain line) of the characteristic when the deviation amount (x [cm], y [cm]) of the center position of the irradiation region R of the incident light is (0.05, 0.05) in FIG. 7A. As shown in FIGS. 7A and 7B, the detection intensity of the incident light has a local maximum value depending on the center position of the irradiation region R of the incident light (spot center coordinates) if r»w is not satisfied. That is, there are two solutions (radii) for one detection intensity.

Figure 8A:
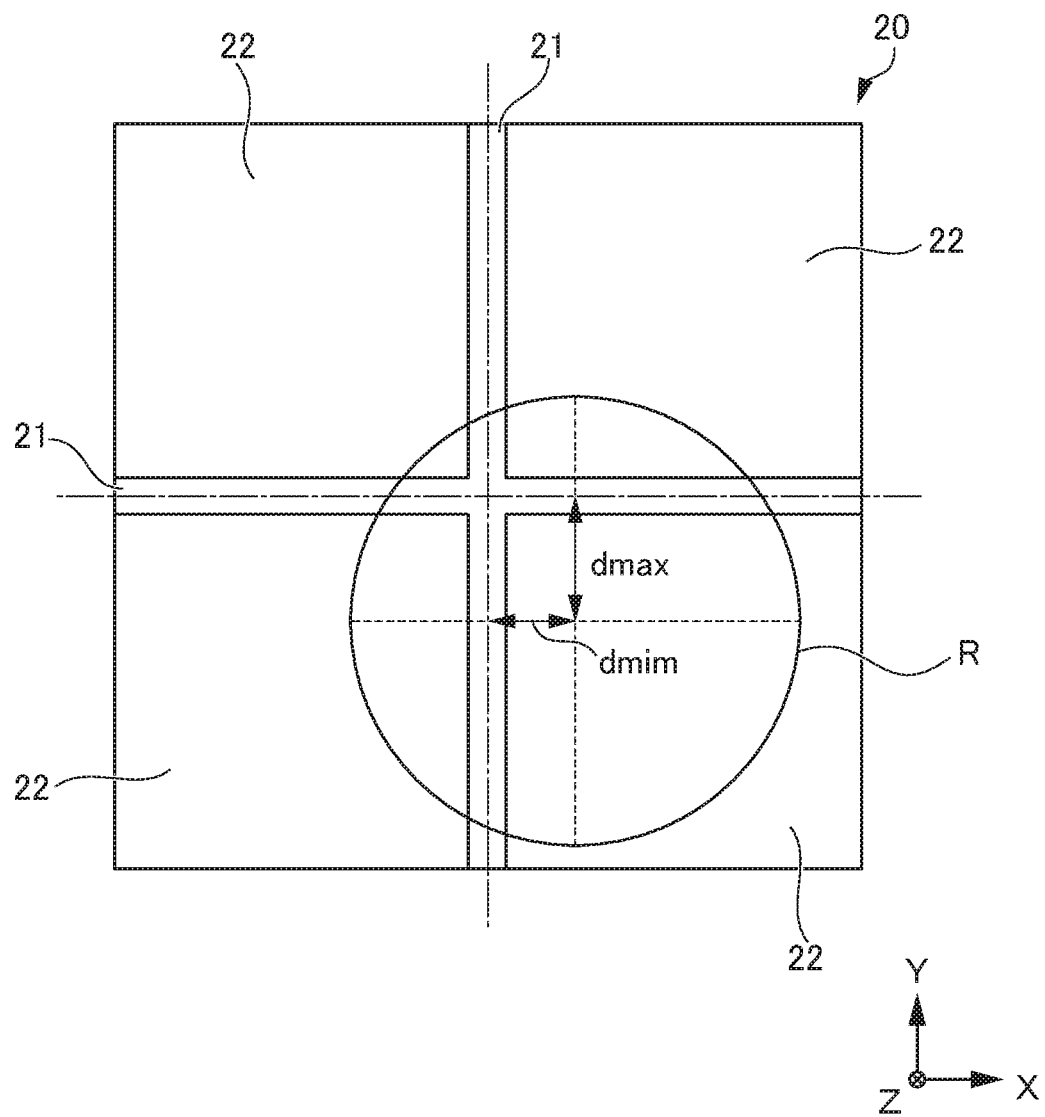
FIG. 8A is a view showing a deviation amount (dmin, dmax) of the center position of the irradiation region of the incident light from a center position of a light receiving surface.

Accordingly, as shown in FIG. 8A, the radius r of the irradiation region R of the incident light may be adjusted to satisfy the following equation based on dmax, which is the larger one of dmin and dmax, when the deviation amount (x, y) of the center position of the irradiation region R of the incident light from the center position of the light receiving surface is (dmin, dmax). For example, the arrangement of the photoelectric conversion elements 10, 20 or the type (curvature) of an optical lens used in combination with the photoelectric conversion device 1 may be adjusted.

$$r > d\ max \times \sqrt{(2)}$$

For example, if the deviation amount dmax of the center position of the irradiation region R of the incident light from the center position of the light receiving surface is 0.05 cm as shown in FIG. 7B, the radius r of the irradiation region R of the incident light is adjusted to be 0.71 cm or longer.

Figure 8B:
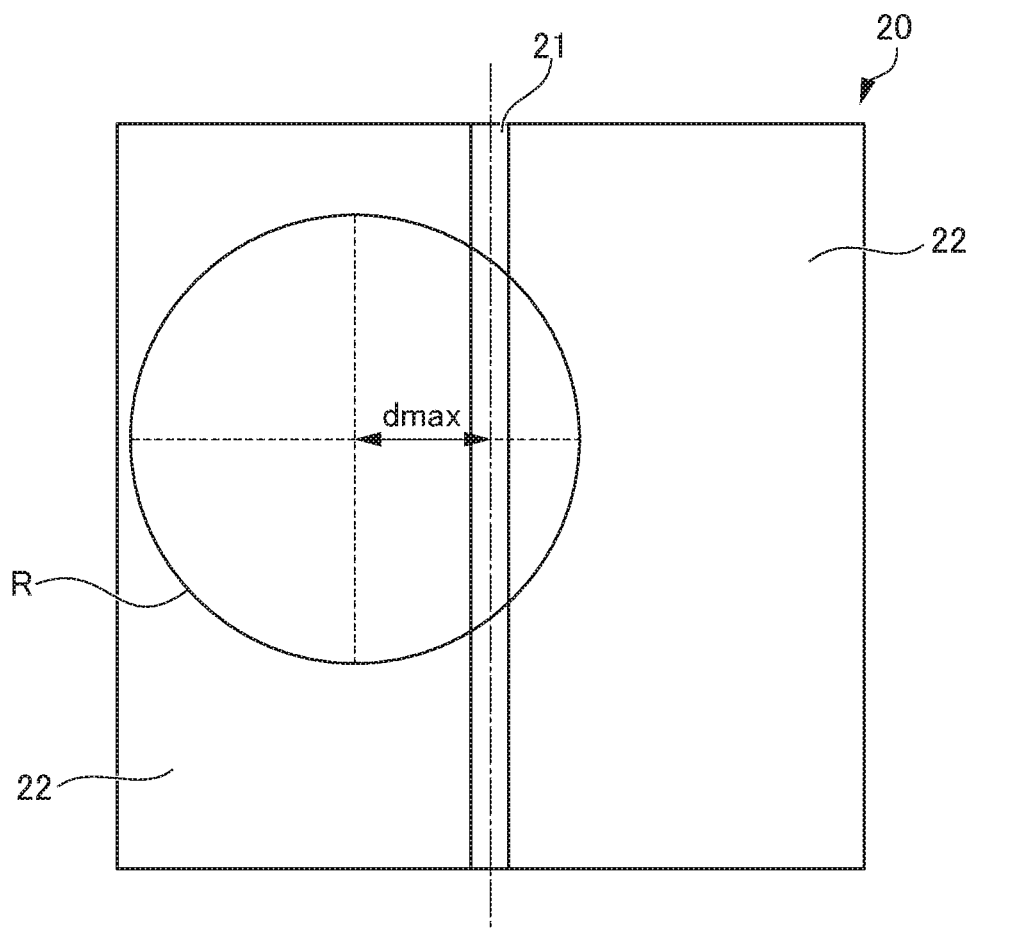
FIG. 8B is a view showing a deviation amount dmax in an X direction of the center position of the irradiation region of the incident light from the center position in the X direction of the light receiving surface.

If the high-sensitive part 21 (high-sensitive region) of the second photoelectric conversion element 20 is formed by one strip-like pattern passing through the center of the light receiving surface and extending in the Y direction as shown in FIG. 8B (to be described later with reference to FIG. 10A), dmax in the above equation may be a deviation amount in the X direction of the center position of the irradiation region R of the incident light from the center position of the light receiving surface in the X direction.

As described above, the first photoelectric conversion element 10 generates a current corresponding to the intensity (total amount) of incident light incident on the light receiving surface in the photoelectric conversion device 1 of this embodiment. The first photoelectric conversion element 10 distributes and outputs the generated current to four pairs of the electrode layers 123, 133 arranged on the four sides according to the XY position (coordinates) of the center of the incident light on the light receiving surface (XY plane). The second photoelectric conversion element 20 generates a current corresponding to the intensity of incident light incident on the high-sensitive part 21 on the light receiving surface. In this way, the second photoelectric conversion element 20 generates a current corresponding to the density of the incident light, i.e. a current corresponding to the spot size of the incident light. The second photoelectric conversion element 20 distributes and outputs the generated current to four pairs of the electrode layers 223, 233 arranged on the four sides according to the XY position (coordinates) of the center of the incident light on the light receiving surface (XY plane).

The calculator 40 calculates and detects the intensity (total amount) of the incident light according to the total amount of the currents output from the four pairs of the electrode layers 123, 133 of the first photoelectric conversion element 10.

The calculator 40 also calculates and detects the XY position (coordinates) of the incident light on the light receiving surface of the first photoelectric conversion element 10 based on a ratio of the currents respectively output from the four pairs of the electrode layers 123, 133 of the first photoelectric conversion element 10. Similarly, the calculator 40 also calculates and detects the XY position (coordinates) of the incident light on the light receiving surface of the second photoelectric conversion element 20 based on a ratio of the currents respectively output from the four pairs of the electrode layers 223, 233 of the second photoelectric conversion element 20. The calculator 40 calculates and detects the incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30 and obtains and detects the spot size of the incident light on the light receiving surface of the second photoelectric conversion element 20 corresponding to the total amount of the currents output from the four pairs of the electrode layers 123, 133 of the first photoelectric conversion element 10 (i.e. the intensity (total amount) of the incident light on the first photoelectric conversion element 10) and the total amount of the currents output from the four pairs of the electrode layers 223, 233 of the second photoelectric conversion element 20 (i.e. the intensity of the incident light on the high-sensitive part of the second photoelectric conversion element 20) at the XY position (coordinates) of the incident light on the light receiving surface of the second photoelectric conversion element 20.

If the intensity of the incident light is known, the spot size of the incident light on the light receiving surface of the second photoelectric conversion element 20 can be detected only by the second photoelectric conversion element 20 without using the first photoelectric conversion element 10. For example, the storage 30 associates the intensity of the incident light instead of the output current (total amount) of the first photoelectric conversion element 10 in the table. The calculator 40 may obtain the spot size of the incident light on the light receiving surface of the second photoelectric conversion element 20 from the intensity of the incident light and the total amount of the currents output from the second photoelectric conversion element 20 (i.e. the intensity of the incident light on the high-sensitive part of the second photoelectric conversion element 20).

Figure 9:
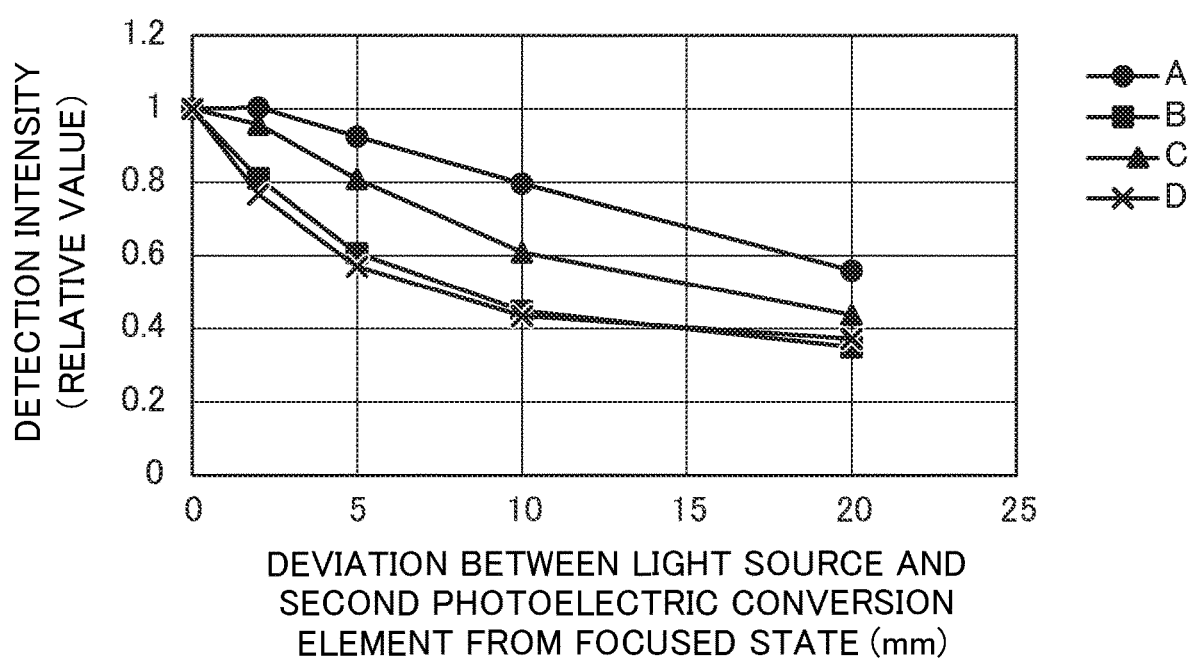
FIG. 9 is a graph showing an example of detection intensities (relative values) of the incident light with the second photoelectric conversion element when a light source is moved away from the second photoelectric conversion element from a state where the incident light from the light source is focused on the light receiving surface of the second photoelectric conversion element (0 mm on a horizontal axis)
Figure 10A:
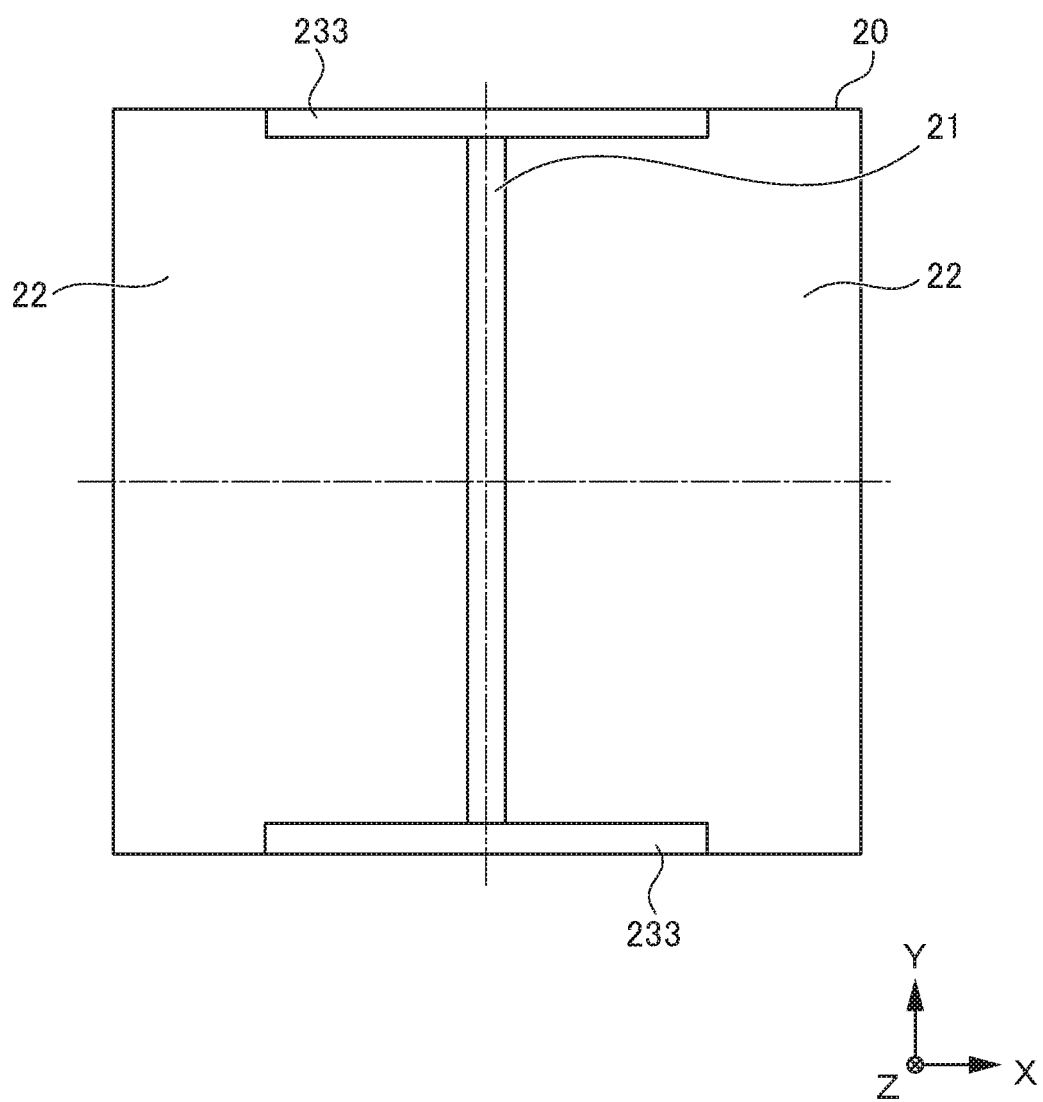
FIG. 10A is a view showing a modification of a pattern of a high-sensitive region of a high-sensitive part of the second photoelectric conversion element.

FIG. 9 is a graph showing an example of detected intensities (relative values) of incident light with the second photoelectric conversion element 20 when the light source is moved away from the second photoelectric conversion element 20 from a state where the incident light (wavelength of 940 nm) from the light source is focused on the light receiving surface of the second photoelectric conversion element 20 (0 mm on a horizontal axis). FIG. 9 shows characteristics A, B and C when the high-sensitive region of the high-sensitive part 21 forms strip-like patterns radially extending in the X and Y directions from the center of the light receiving surface and orthogonal to each other as shown in FIG. 4 and the width thereof is 1.5 mm, 1.0 mm and 0.5 mm respectively, and a characteristic D when the high-sensitive region of the high-sensitive part 21 forms a strip-like pattern passing through the center of the light receiving surface and extending in the Y direction as shown in FIG. 10A and the width thereof is 0.5 mm.

According to the characteristic A, it is understood that a more linear detection characteristic is obtained even if a detection distance is long as the patterns in the high-sensitive region of the high-sensitive part 21 become wider. Further, according to the characteristics C and D, it is understood that a more linear detection characteristic is obtained when the detection distance is short as the patterns in the high-sensitive region of the high-sensitive part 21 become narrower. From these results, it is understood that the wide patterns in the high-sensitive region of the high-sensitive part 21 are suitable for long-distance light detection and the narrow patterns in the high-sensitive region of the high-sensitive part 21 are suitable for short-distance light detection.

(Modification)

Although the photoelectric conversion element 20 in which the passivation layer 230, the n-type semiconductor layer 231 and the transparent electrode layer 232 are not formed on the back surface sides of the low-sensitive parts 22 is illustrated in this embodiment, there is no limitation to this. The second photoelectric conversion element 20 may be formed such that a passivation layer, a conductivity type semiconductor layer and a transparent electrode layer are not formed on at least one of the light receiving surface side and the back surface side of the low-sensitive part 22. In other words, strip-like pattern(s) in the high-sensitive part 21 (high-sensitive region) may be formed on at least one of the light receiving surface side and the back surface side of the second photoelectric conversion element 20.

For example, contrary to the aforementioned embodiment, strip-like pattern(s) of the high-sensitive part 21 (high-sensitive region) may be formed on the light receiving surface side of the second photoelectric conversion element 20. More specifically, the passivation layer 230, the n-type semiconductor layer 231 and the transparent electrode layer 232 are formed in the high-sensitive region on the back surface side of the high-sensitive part 21 and in the low-sensitive regions on the back surface sides of the low-sensitive parts 22, and the passivation layer 220, the conductivity type semiconductor layer 221 and the transparent electrode layer 222 are formed in the high-sensitive region on the light receiving surface side of the high-sensitive part 21. On the other hand, the passivation layer 220, the conductivity type semiconductor layer 221 and the transparent electrode layer 222 are not formed in the low-sensitive regions on the light receiving surface sides of the low-sensitive parts 22. Since the recombination of carriers increases on the light receiving surface sides, where light is more absorbed, in the low-sensitive parts 22 in this case, a sensitivity difference between the high-sensitive part 21 and the low-sensitive parts 22 particularly with respect to a short wavelength region of the incident light becomes clearer. In this case, optical characteristics (e.g. reflection characteristic) on the light receiving surface may be separately adjusted.

A transparent electrode layer may be formed or a conductivity type semiconductor layer and a transparent electrode layer may be formed in the low-sensitive parts 22 of the second photoelectric conversion element 20. Particularly, if the transparent electrode layer is formed on the light receiving surface sides of the low-sensitive regions of the second photoelectric conversion element 20 when the passivation layer is not formed, optical characteristics (e.g. reflection characteristic) on the light receiving surface side are improved.

An optical sensor is provided with a pan (swing in a horizontal (lateral) direction)) mechanism or a tilt (swing in a vertical (up-down) direction) mechanism in some cases. For example, in the case of applying the photoelectric conversion device 1 of this embodiment to an optical sensor provided with the pan mechanism, the high-sensitive region of the high-sensitive part 21 of the second photoelectric conversion element 20 may be formed by one strip-like pattern passing through the center of the light receiving surface and extending in the Y direction as shown in FIG. 10A. In this case, since the incident light is adjusted to be located at a center of the light receiving surface in the X direction by the pan mechanism, the first photoelectric conversion element 10 and the calculator 40, and the second photoelectric conversion element 20 and the calculator 40 may respectively detect the position of the incident light in the Y direction. The position of the incident light in the X direction is obtained from an angle of the pan mechanism. On the other hand, in the case of applying the photoelectric conversion device 1 of this embodiment to an optical sensor provided with the tilt mechanism, the high-sensitive region of the high-sensitive part 21 of the second photoelectric conversion element 20 may be formed by one strip-like pattern passing through the center of the light receiving surface and extending in the X direction. In this case, since the incident light is adjusted to be located at a center of the light receiving surface in the Y direction by the tilt mechanism, the first photoelectric conversion element 10 and the calculator 40, and the second photoelectric conversion element 20 and the calculator 40 may respectively detect the position of the incident light in the X direction. The position of the incident light in the Y direction is obtained from an angle of the tilt mechanism.

In the case of applying the photoelectric conversion device 1 of this embodiment to an optical sensor provided with the pan mechanism and the tilt mechanism, the incident light is adjusted to be located at a center of the light receiving surface in the X and Y directions by the pan mechanism and the tilt mechanism. Thus, the first photoelectric conversion element 10 and the calculator 40, and the second photoelectric conversion element 20 and the calculator 40 may not respectively detect the positions of the incident light in the X and Y directions. The positions of the incident light in the X and Y directions are obtained from the angles of the pan mechanism and the tilt mechanism.

Figure 10B:
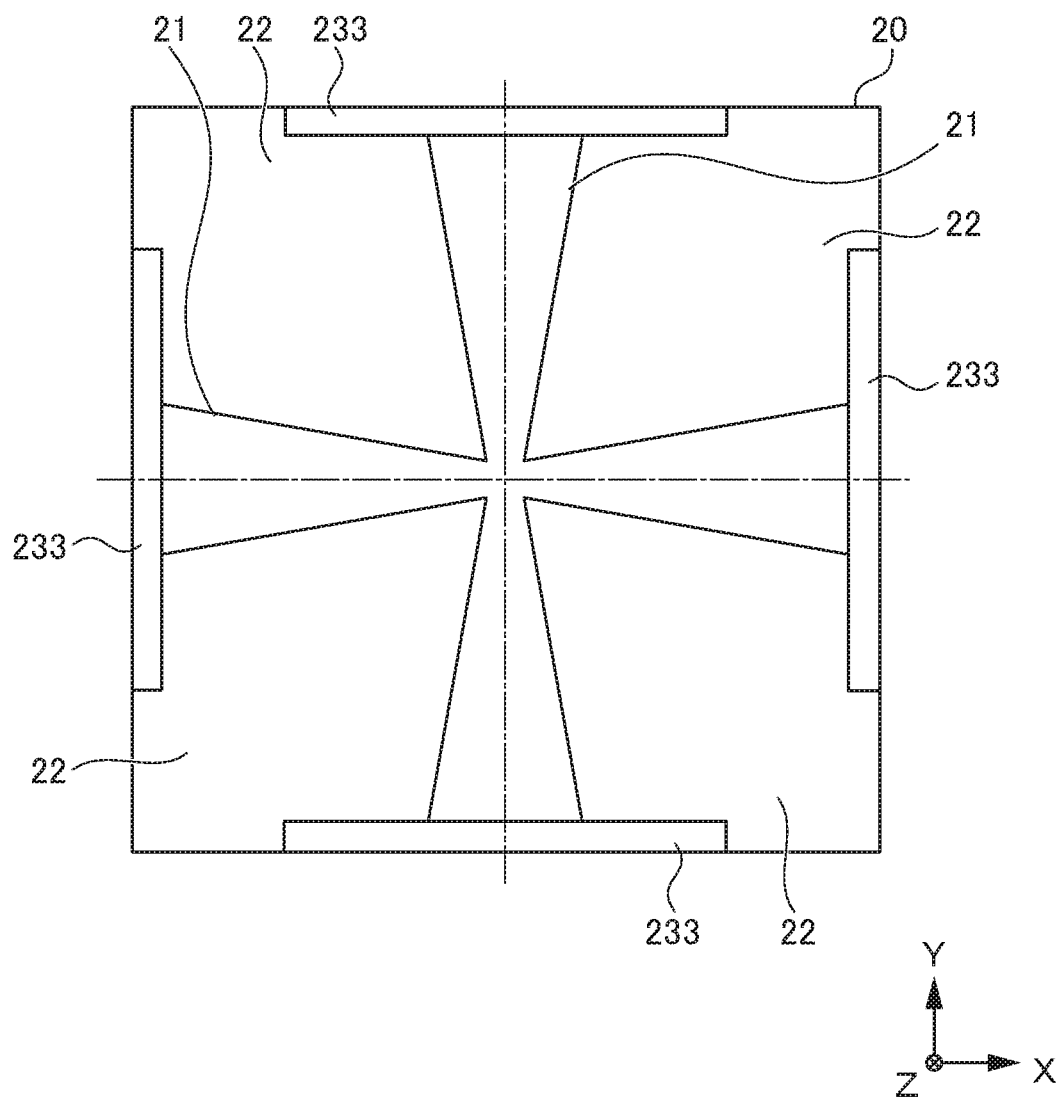
FIG. 10B is a view showing a modification of patterns of the high-sensitive region of the high-sensitive part of the second photoelectric conversion element.

In the case of applying the photoelectric conversion device 1 of this embodiment to the optical sensor provided with the pan mechanism and the tilt mechanism, the high-sensitive region of the high-sensitive part 21 of the second photoelectric conversion element 20 may be formed by patterns gradually widened along the X and Y directions from the center of the light receiving surface as shown in FIG. 10B. In this case, a change of the output current due to a change of the spot size becomes linear. In contrast, if the high-sensitive region of the high-sensitive part 21 of the second photoelectric conversion element 20 is formed by patterns having a constant width along the X and Y directions from the center of the light receiving surface as shown in FIG. 4, calculation in the calculator 40 is easy.

In this embodiment, the high-sensitive region of the high-sensitive part 21 of the second photoelectric conversion element 20 may be formed by three or more strip-like patterns radially extending from the center of the light receiving surface. The high-sensitive region of the high-sensitive part 21 of the second photoelectric conversion element 20 may also be formed by a plurality of island-like (dot-like) patterns. In this case, the density of the island-like patterns may change as the island-like patterns radially spread from the center of the light receiving surface or the size of the island-like patterns may change as the island-like patterns radially spread from the center of the light receiving surface. In this case, the island-like patterns radially spreading from the center of the light receiving surface may be electrically connected, and connected to the electrode layer. The high-sensitive region of the high-sensitive part 21 of the second photoelectric conversion element 20 may also be formed by a lattice-like pattern. In this case, there are a plurality of intersections, and singularities where the output current increases when the center of the incident light approaches these intersections are expected to be created. Thus, the output current is preferably corrected at these singularities.

Although the first sensitive part 21 (first sensitive region) is a high-sensitive part (high-sensitive region) and the second sensitive part 22 (second sensitive region) is a low-sensitive part (low-sensitive region) in the second photoelectric conversion element 20 in this embodiment, the arrangement may be reversed. In other words, the first sensitive part 21 (first sensitive region) may be a low-sensitive part (low-sensitive region) and the second sensitive part 22 (second sensitive region) may be a high-sensitive part (high-sensitive region) in the second photoelectric conversion element 20. In this case, the output current increases as the density of the incident light decreases, i.e. as the spot size of the incident light becomes larger.

Second Embodiment

A three-dimensional sensor for detecting a position in a Z direction (depth) in addition to positions in X and Y directions (XY position) of a subject by causing diffused light from the subject to be incident thereon is known as an optical sensor. In such a three-dimensional sensor, if the position of the subject in the Z direction (depth) changes, the spot size of incident light incident on a photoelectric conversion element inside changes (defocusing).

Accordingly, if the aforementioned photoelectric conversion device 1 is applied to such a three-dimensional sensor, the position of the subject in the Z direction (depth) can be detected by detecting the spot size of incident light incident on the photoelectric conversion element. The three-dimensional position of the subject can be detected from an incident direction of the incident light and the position in the Z direction (depth).

Figure 11:
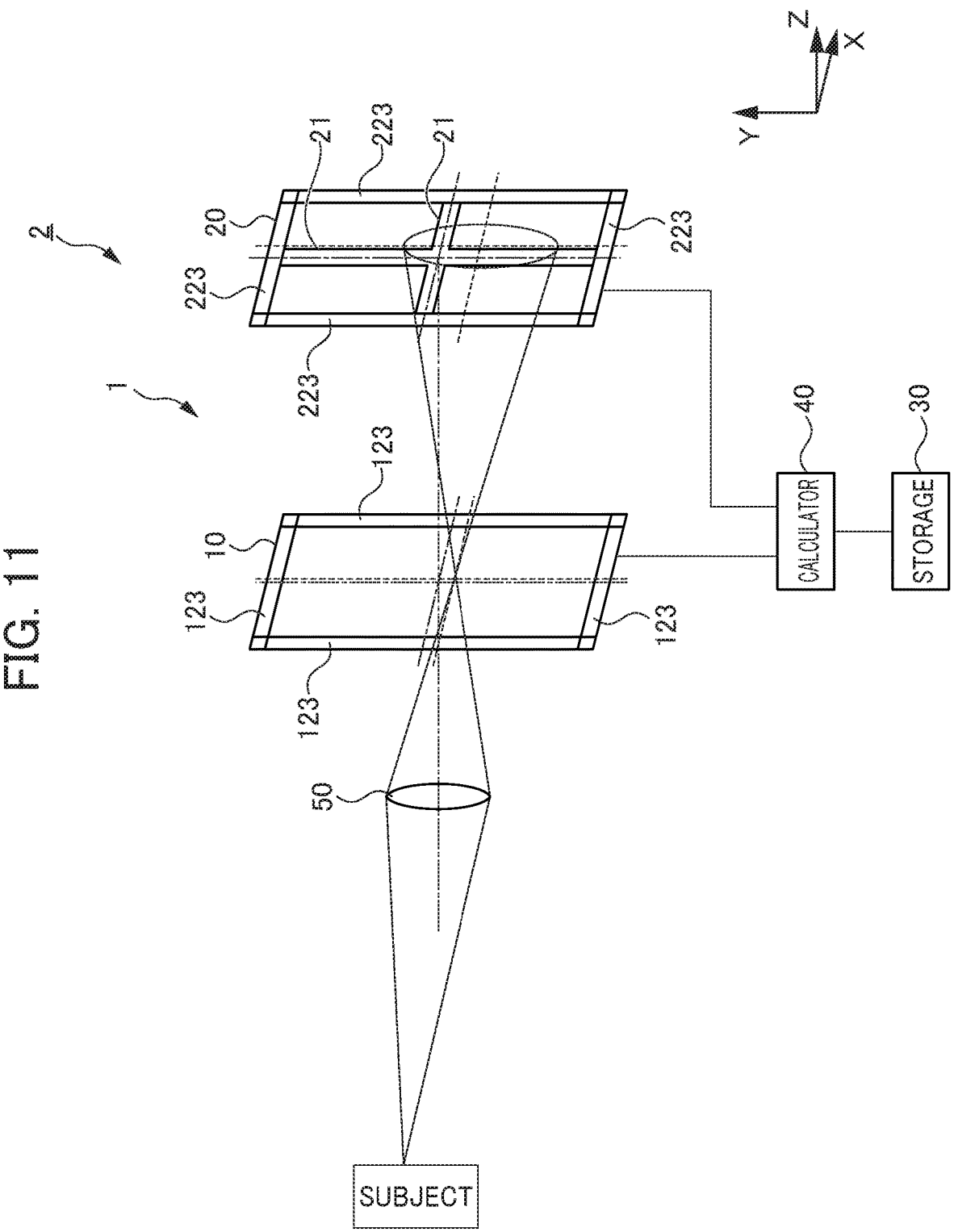
FIG. 11 is a view showing the configuration of a three-dimensional sensor according to a second embodiment.

FIG. 11 is a view showing the configuration of a three-dimensional sensor according to a second embodiment. The three-dimensional sensor 2 shown in FIG. 11 is provided with an optical lens 50 for condensing an optical image (diffused light) emitted from a subject, for example, by irradiating laser light to the subject, and the aforementioned photoelectric conversion device 1, on which the condensed light from the optical lens 50 is incident, i.e. the first photoelectric conversion element 10, the second photoelectric conversion element 20, the storage 30 and the calculator 40.

In this embodiment, the first photoelectric conversion element 10 is arranged at a focus position of the optical lens 50. The first photoelectric conversion element 10 generates a current corresponding to the intensity (total amount) of focused incident light incident on the light receiving surface. The first photoelectric conversion element 10 distributes and outputs the generated current to the four electrode layers 123 (133) arranged on the four sides according to the XY position (coordinates) of a center of the incident light on the light receiving surface (XY plane). The first photoelectric conversion element 10 also transmits the incident light.

The second photoelectric conversion element 20 generates a current corresponding to the intensity of the defocused incident light incident on the high-sensitive part on the light receiving surface. In this way, the second photoelectric conversion element 20 generates a current corresponding to the density of the incident light, i.e. a current corresponding to the spot size of the incident light. The second photoelectric conversion element 20 distributes and outputs the generated current to the four electrode layers 223 (233) arranged on the four sides according to the XY position (coordinates) of the center of the incident light on the light receiving surface (XY plane).

The storage 30 stores in advance a table associating an output current (total amount) of the first photoelectric conversion element 10 (i.e. the intensity (total amount) of incident light on the first photoelectric conversion element 10) and an output current (total amount) of the second photoelectric conversion element 20 (i.e. the intensity of the incident light on the high-sensitive part of the second photoelectric conversion element 20) with the spot size of the incident light on the light receiving surface of the second photoelectric conversion element 20 for each XY position (coordinates) of the incident light on the light receiving surface of the second photoelectric conversion element 20 and further associating the position of the subject in the Z direction (depth) with the spot size.

The calculator 40 calculates and detects the intensity (total amount) of the incident light according to the total amount of currents output from the four electrode layers 123 (133) of the first photoelectric conversion element 10 as described above. The calculator 40 also calculates and detects the XY position (coordinates) of the incident light on the light receiving surface of the first photoelectric conversion element 10 based on a ratio of the currents output from each of the four electrode layers 123 (133) of the first photoelectric conversion element 10 as described above. Similarly, the calculator 40 also calculates and detects the XY position (coordinates) of the incident light on the light receiving surface of the second photoelectric conversion element 20 based on a ratio of currents output from each of the four electrode layers 223 (233) of the second photoelectric conversion element 20. The calculator 40 calculates and detects the incident direction of the incident light from the XY position (coordinates) of the incident light on the light receiving surface of the first photoelectric conversion element 10 and the XY position (coordinates) of the incident light on the light receiving surface of the second photoelectric conversion element 20.

The calculator 40 also refers to the table stored in the storage 30, and obtains and detects the spot size of the incident light on the light receiving surface of the second photoelectric conversion element 20 corresponding to the total amount of the currents output from the first photoelectric conversion element 10 (i.e. the intensity (total amount) of the incident light on the first photoelectric conversion element 10) and the total amount of the currents output from the second photoelectric conversion element 20 (i.e. the intensity of the incident light on the high-sensitive part of the second photoelectric conversion element 20) at the XY position (coordinates) of the incident light on the light receiving surface of the second photoelectric conversion element 20, and the position of the subject in the Z direction (depth). Then, the calculator 40 detects the three-dimensional position of the subject from the incident direction of the incident light and the position in the Z direction (depth) detected as described above.

Although the embodiments of the present disclosure have been described above, the present disclosure is not limited to the above embodiments and various modifications can be made. For example, although the hetero-junction type photoelectric conversion elements 10, 20 have been illustrated as shown in FIGS. 2 and 3 in the above embodiments, the features of the present disclosure are not limited to hetero-junction type photoelectric conversion elements and are applicable to various photoelectric conversion elements such as homo-junction type photoelectric conversion elements.

In the above embodiments, p-type semiconductor layers have been illustrated as the conductivity type semiconductor layers 121, 122 on the light receiving surface side and n-type semiconductor layers have been illustrated as the conductivity type semiconductor layers 131, 231 on the back surface side. However, the conductivity type semiconductor layers 121, 221 on the light receiving surface side may be n-type semiconductor layers in which an amorphous silicon material is doped with an n-type dopant (e.g. phosphorus (P) described above), and the conductivity type semiconductor layers 131, 231 on the back surface side may be p-type semiconductor layers in which an amorphous silicon material is doped with a p-type dopant (e.g. boron (B) described above).

Although n-type semiconductor substrates have been illustrated as the semiconductor substrates 110, 210 in the above embodiments, the semiconductor substrates 110, 210 may be p-type semiconductor substrates in which a crystalline silicon material is doped with a p-type dopant (e.g. boron (B) described above).

Although the photoelectric conversion elements each including the crystalline silicon substrate have been illustrated in the above embodiments, there is no limitation to this. For example, the photoelectric conversion element may include a gallium arsenide (GaAs) substrate.

What is claimed is:

1. A photoelectric conversion element comprising:
   a photoelectric conversion substrate having first and second principal surfaces, the photoelectric conversion substrate comprising a first sensitive part and a second sensitive part having different photoelectric conversion characteristics, wherein
   when a sensitive region appearing on the first principal surface of the first sensitive part is defined as a first sensitive region and a sensitive region appearing on the first principal surface of the second sensitive part is defined as a second sensitive region, the first sensitive region
      receives at least a portion of incident light incident on the first principal surface, and
      forms at least two or more strip-like patterns radially extending on the first principal surface for decreasing a ratio of the first sensitive region to the second sensitive region in an irradiation region as the irradiation region irradiated with the incident light on the first principal surface increases.

2. The photoelectric conversion element according to claim 1, wherein the first sensitive region forms two orthogonal strip-like patterns.

3. The photoelectric conversion element according to claim 1, wherein at least one of the strip-like patterns has a constant width.

4. The photoelectric conversion element according to claim 1, wherein the strip-like pattern becomes wider from a center toward a periphery of the first principal surface.

5. A photoelectric conversion element comprising:
   a photoelectric conversion substrate having first and second principal surfaces, the photoelectric conversion substrate comprising a first sensitive part and a second sensitive part having different photoelectric conversion characteristics; and
   a plurality of electrodes for outputting currents, wherein the plurality of electrodes are separated and arranged on a peripheral part of the photoelectric conversion substrate, and
   when a sensitive region appearing on the first principal surface of the first sensitive part is defined as a first sensitive region and a sensitive region appearing on the first principal surface of the second sensitive part is defined as a second sensitive region, the first sensitive region
      receives at least a portion of incident light incident on the first principal surface, and
      forms a pattern for decreasing a ratio of the first sensitive region to the second sensitive region in an irradiation region as the irradiation region irradiated with the incident light on the first principal surface increases.

6. The photoelectric conversion element according to claim 1, wherein the photoelectric conversion substrate contains a single-crystal silicon material.

7. The photoelectric conversion element according to claim 6, further comprising
   a first conductivity type semiconductor layer formed on the first principal surface of the photoelectric conversion substrate, and
   a second conductivity type semiconductor layer formed on the second principal surface of the photoelectric conversion substrate.

8. The photoelectric conversion element according to claim 7, wherein
   the second sensitive part has a photoelectric conversion characteristic lower than in the first sensitive part,
   passivation layers are formed on the first and second principal surfaces in the first sensitive part, and
   the passivation layers are not formed on at least one of the first and second principal surfaces in the second sensitive part.

9. The photoelectric conversion element according to claim 8, wherein
   one of the passivation layers, along with the first conductivity type semiconductor layer and a transparent electrode layer are successively formed in the first sensitive region and the second sensitive region on a light receiving surface side, which is the first principal surface on a light receiving side,
   an other of the passivation layers, along with the second conductivity type semiconductor layer and an other transparent electrode layer are successively formed in the first sensitive region on a back surface side, which is the second principal surface on a side opposite to the light receiving surface, and the other of the passivation layers, the second conductivity type semiconductor layer and the other transparent electrode layer are not formed in the second sensitive region on the back surface side.

10. The photoelectric conversion element according to claim 8, wherein
one of the passivation layers, along with the second conductivity type semiconductor layer and a transparent electrode layer are successively formed in the first sensitive region and the second sensitive region on a back surface side, which is the second principal surface on a side opposite to a light receiving surface serving as the first principal surface on a light receiving side,
an other of the passivation layers, along with the first conductivity type semiconductor layer and an other transparent electrode layer are successively formed in the first sensitive region on the light receiving surface side, and
the other of the passivation layers, the first conductivity type semiconductor layer and the other transparent electrode layer are not formed in the second sensitive region on the light receiving surface side.

11. A photoelectric conversion device, comprising
a first photoelectric conversion element arranged on an upstream side of incident light, and
the photoelectric conversion element according to claim 1 arranged on a downstream side of the incident light and serving as a second photoelectric conversion element.

12. The photoelectric conversion device according to claim 11, further comprising
a calculator for calculating a spot size of the incident light on the second photoelectric conversion element based on an output current of the first photoelectric conversion element and an output current of the second photoelectric conversion element.

13. The photoelectric conversion element according to claim 2, wherein at least one of the strip-like patterns has a constant width.

14. The photoelectric conversion element according to claim 2, wherein at least one of the strip-like patterns becomes wider from a center toward a periphery of the first principal surface.

15. The photoelectric conversion element according to claim 1, further comprising
a plurality of electrodes for outputting currents, wherein the plurality of electrodes are separated and arranged on a peripheral part of the photoelectric conversion substrate.

16. The photoelectric conversion element according to claim 2, wherein the photoelectric conversion substrate contains a single-crystal silicon material.

17. A photoelectric conversion device, comprising
a first photoelectric conversion element arranged on an upstream side of incident light, and
the photoelectric conversion element according to claim 2 arranged on a downstream side of the incident light and serving as a second photoelectric conversion element.

18. A photoelectric conversion element comprising:
a photoelectric conversion substrate having first and second principal surfaces, the photoelectric conversion substrate comprising a first sensitive part and a second sensitive part having different photoelectric conversion characteristics;
a first conductivity type semiconductor layer formed on the first principal surface of the photoelectric conversion substrate; and
a second conductivity type semiconductor layer formed on the second principal surface of the photoelectric conversion substrate, wherein
the photoelectric conversion substrate contains a single-crystal silicon material,
the second sensitive part has a photoelectric conversion characteristic lower than in the first sensitive part,
passivation layers are formed on the first and second principal surfaces in the first sensitive part,
the passivation layers are not formed on at least one of the first and second principal surfaces in the second sensitive part, and
when a sensitive region appearing on the first principal surface of the first sensitive part is defined as a first sensitive region and a sensitive region appearing on the first principal surface of the second sensitive part is defined as a second sensitive region, the first sensitive region
receives at least a portion of incident light incident on the first principal surface, and
forms a pattern for decreasing a ratio of the first sensitive region to the second sensitive region in an irradiation region as the irradiation region irradiated with the incident light on the first principal surface increases.

* * * * *